US012813298B2

(12) United States Patent
Duan et al.

(10) Patent No.: US 12,813,298 B2
(45) Date of Patent: Nov. 24, 2026

(54) LOW Z-HEIGHT, GLASS-REINFORCED PACKAGE WITH EMBEDDED BRIDGE

(71) Applicant: Intel Corporation, Santa Clara, CA (US)

(72) Inventors: Gang Duan, Chandler, AZ (US); Rahul Manepalli, Chandler, AZ (US); Srinivas Pietambaram, Chandler, AZ (US); Brandon Marin, Gilbert, AZ (US); Suddhasattwa Nad, Chandler, AZ (US); Jeremy Ecton, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/080,612

(22) Filed: Dec. 13, 2022

(65) Prior Publication Data

US 2024/0194608 A1 Jun. 13, 2024

(51) Int. Cl.
*H01L 21/56* (2006.01)
*H10P 72/70* (2026.01)
(Continued)

(52) U.S. Cl.
CPC ............. *H10W 70/65* (2026.01); *H10P 72/74* (2026.01); *H10W 70/093* (2026.01);
(Continued)

(58) Field of Classification Search
CPC ...... H10P 72/74; H10P 72/743; H10W 70/09; H10W 70/093; H10W 70/095; H10W 70/60; H10W 70/611; H10W 70/635; H10W 70/65; H10W 72/20; H10W 74/016; H10W 74/019; H10W 74/117; H10W 90/00
See application file for complete search history.

(56) References Cited

U.S. PATENT DOCUMENTS

2010/0164030 A1* 7/2010 Oggioni ................ H10W 70/69 257/E31.127
2017/0186726 A1* 6/2017 Tang ..................... H10W 42/00
(Continued)

OTHER PUBLICATIONS

Extended European Search Report from European Patent Application No. 23199562.2 notified Mar. 11, 2024, 8 pgs.

*Primary Examiner* — Jaehwan Oh
(74) *Attorney, Agent, or Firm* — Essential Patents Group, LLP

(57) ABSTRACT

An integrated circuit (IC) package comprises a first IC die having first metallization features, a second IC die having second metallization features, and a third IC die having third metallization features. A glass layer is between the third IC die and both of the first IC die and the second IC die. A plurality of first through vias extend through the glass layer, coupling the third metallization features with first ones of the first metallization features and with first ones of the second metallization features. A plurality of second through vias extend through the glass layer. A dielectric material is around the third die and a package metallization is within the dielectric material. The package metallization is coupled to at least one of the first, second, or third IC die, and terminating at a plurality of package interconnect interfaces.

20 Claims, 9 Drawing Sheets

(51) Int. Cl.

| | |
|---|---|
| ***H10W 70/05*** | (2026.01) |
| ***H10W 70/60*** | (2026.01) |
| ***H10W 70/63*** | (2026.01) |
| ***H10W 70/65*** | (2026.01) |
| ***H10W 74/01*** | (2026.01) |
| ***H10W 74/10*** | (2026.01) |

(52) U.S. Cl.

CPC ........ *H10W 70/095* (2026.01); *H10W 70/611* (2026.01); *H10W 70/635* (2026.01); *H10W 74/016* (2026.01); *H10W 74/019* (2026.01); *H10W 74/117* (2026.01); *H10P 72/743* (2026.01)

(56) References Cited

U.S. PATENT DOCUMENTS

| | | | | |
|---|---|---|---|---|
| 2018/0226349 | A1 | 8/2018 | Yu et al. | |
| 2019/0148276 | A1 | 5/2019 | Chen et al. | |
| 2020/0027728 | A1* | 1/2020 | Wang .................. | H10P 14/2922 |
| 2021/0225737 | A1 | 7/2021 | Fang | |

* cited by examiner

LOW Z-HEIGHT, GLASS-REINFORCED PACKAGE WITH EMBEDDED BRIDGE

BACKGROUND

Heterogeneous integration technology enables semiconductor device manufacturers to combine functional components from different manufacturing process flows into a single composite device with complex and advanced functionality. As demands for high performance computing (HPC) continue to rise, heterogeneous integration has become an important approach to meet this demand. Scaling heterogeneous integrated devices focuses on increasing interconnect density, increasing bandwidth, and improving power efficiency.

Various packaging architectures have been deployed to increase planar and 3D input/output (I/O) wire/area density to provide higher data bandwidth. These packaging architectures are intended to improve die disaggregation or heterogeneous integration, as well as to shorten the time to market. More recently, 2.5D/3D advanced packaging technologies, such as die embedding or the use of silicon interposers, have been introduced, which are designed to enable significantly higher package I/O counts and density. The goal of these more recent advanced packaging technologies is to meet the HPC market segment demands and product performance needs. The need for higher bandwidth and smaller I/O pitch drives innovative die disaggregation and die-to-die (D2D) connection solutions. In addition, client computing devices, smart phones, and various consumer electronic devices require semiconductor packages with a low z-height and small footprint.

Organic-based Embedded Multi-die Interconnect Bridge (EMIB) is another advanced packaging technology, which is presently limited to about 30 μm pitch for D2D connections due to various technical challenges.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels are repeated among the figures to indicate corresponding or analogous elements. In the figures.

DETAILED DESCRIPTION OF EXEMPLARY EMBODIMENTS

Figure 1A:
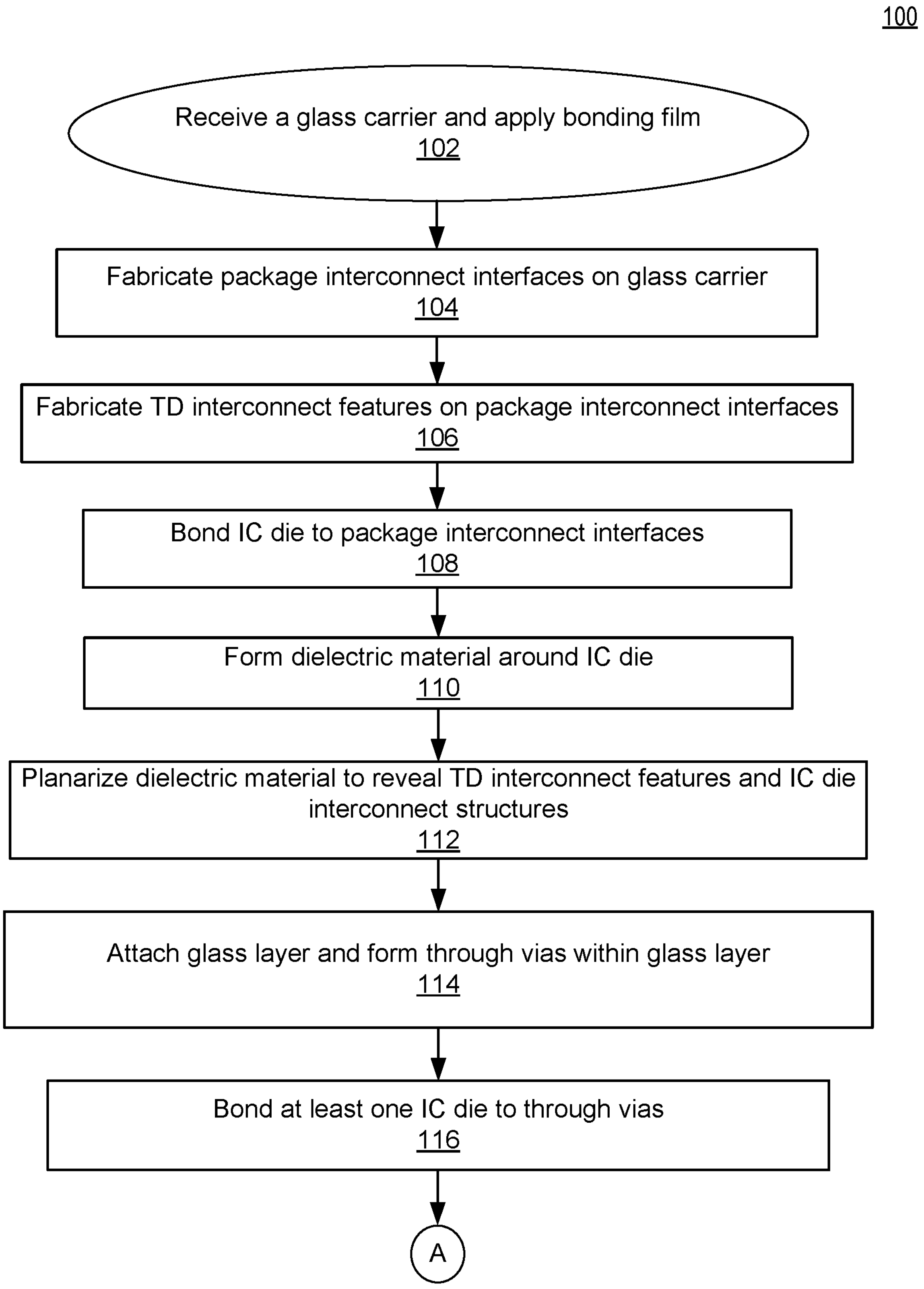
FIGS. 1A and 1B illustrate a flow diagram of methods for fabricating a low-z height IC package with a glass reinforcement layer and an embedded bridge, in accordance with some embodiments.

Embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or functional changes may be made without departing from the scope of claimed subject matter. It should also be noted that directions and references (e.g., up, down, top, bottom, etc.) may be used merely to facilitate the description of features in the drawings and relationship between the features. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with each of the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, optical, or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or structure disposed over or under another may be directly in contact or may have one or more intervening materials. Moreover, one material disposed between two materials may be directly in contact with the two materials or may have one or more intervening materials. In contrast, a first material or structure "on" a second material or structure is in direct contact with that second material/structure. Similar distinctions are to be made in the context of component assemblies where a first component may be "on" or "over" a second component.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Examples of IC packages are described below. The IC packages are formed on sacrificial glass carrier, and include a glass layer. The IC packages include at least two IC die, with the IC die on opposite sides of the glass layer. In some embodiments, the IC packages include a first IC die and second IC die on one side of the glass layer and third IC die on the opposite side. A plurality of first through vias extend through the glass layer. In some embodiments, the third IC die is a bridge coupling the first IC die and second IC die, which may be either an active or passive bridge. In some embodiments, the third IC device can include inductors, capacitors, voltage regulators, or other active components. The IC packages may be fabricated in wafer level or panel level processes, either with or without fanout.

Presently, organic-based embedded multi-die interconnect Bridge (EMIB) are limited to about 30 μm pitch for die-to-die (D2D) connections due to various technical challenges. An advantage of the example IC packages described herein is that connections to embedded bridges can be fabricated at pitches greater than or equal to 25 μm for D2D connections. Another advantage of the example IC packages described herein is the packages can have a low z-height. A further advantage is that the thin glass layer provides the IC package with mechanical strength and reinforcement, while enabling a lower z-height than other IC packages. Low z-height are desirable for use in thin electronic devices, such as laptop computers and smart phones.

The IC packages described herein may be manufactured with a hybrid of monolithic and die-level bonding techniques to form one or more of the features or attributes provided in accordance with various embodiments. Individual IC die within an IC package may be partially or fully fabricated in a monolithic process separate from that of other IC dies included in the package. As such, the IC die(s) may utilize the same or different semiconductor device technologies as the host chip. Partially or completely fabricated IC die may be singulated from a wafer, and placed on a sacrificial glass carrier, for example by a pick-and-place operation at a particular stage of host wafer BEOL metallization. IC die attach may comprise a metal feature bonding or metal feature and dielectric (hybrid) bonding.

The feature pitch at the chiplet-to-host interface metallization may absorb chiplet-host alignment imprecision. Such an architecture enables higher density interconnection between an IC package and a host component.

A number of different assembly and/or fabrication methods may be practiced to generate an IC package having one or more of the features or attributes described herein. FIG. 1A illustrates a flow diagram of methods 100 for fabricating a low-z height IC package with a glass reinforcement layer and an embedded bridge, in accordance with some embodiments. Methods 100 begin at block 102, where a glass carrier is received as a starting material and a temporary bonding film (TBF) is applied.

Figure 2:
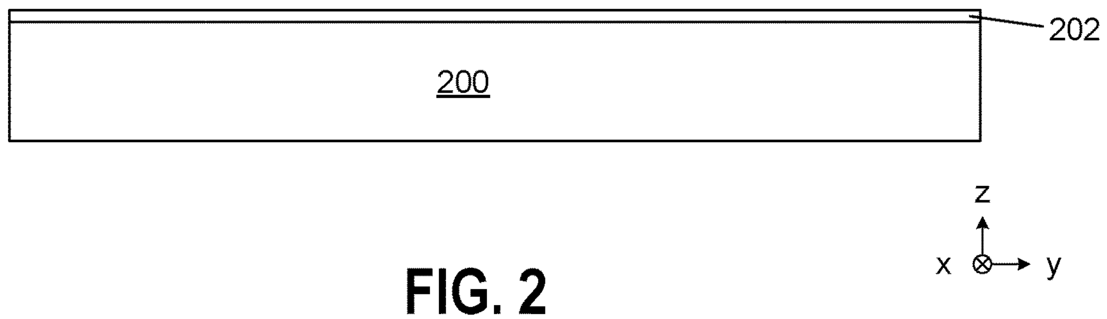
FIG. 2 illustrates a cross-sectional view of a glass carrier in accordance with some embodiments.
Figure 3A:
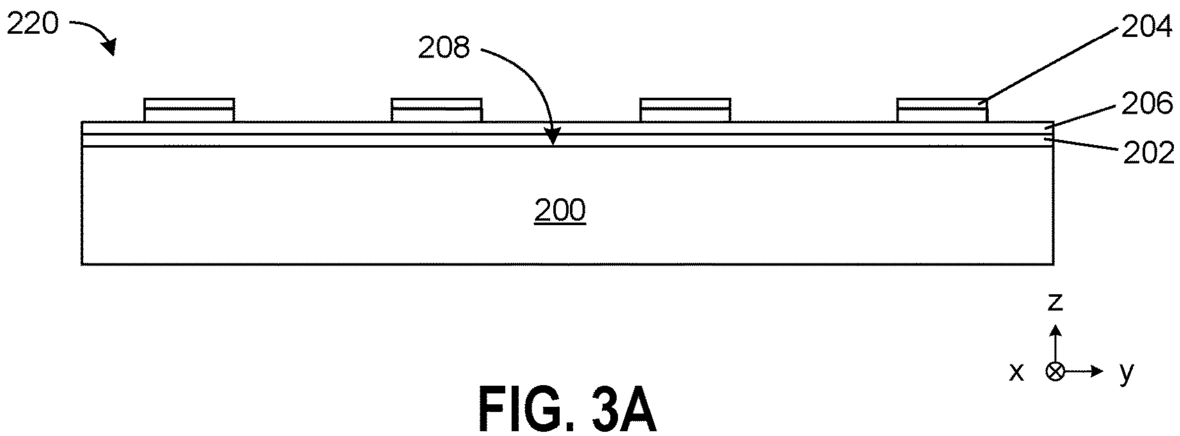
FIGS. 3A to 3N illustrate cross-sectional views of an IC package including a glass layer between IC die on each side of the glass layer, and having through vias coupling the IC die, evolving as the methods illustrated in FIGS. 1A-1B are practiced, in accordance with some embodiments.
Figure 3B:
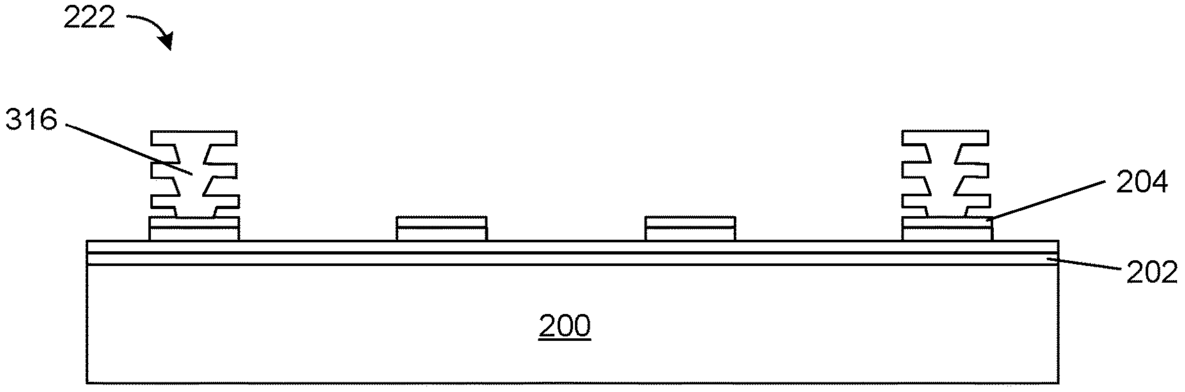
Figure 3C:
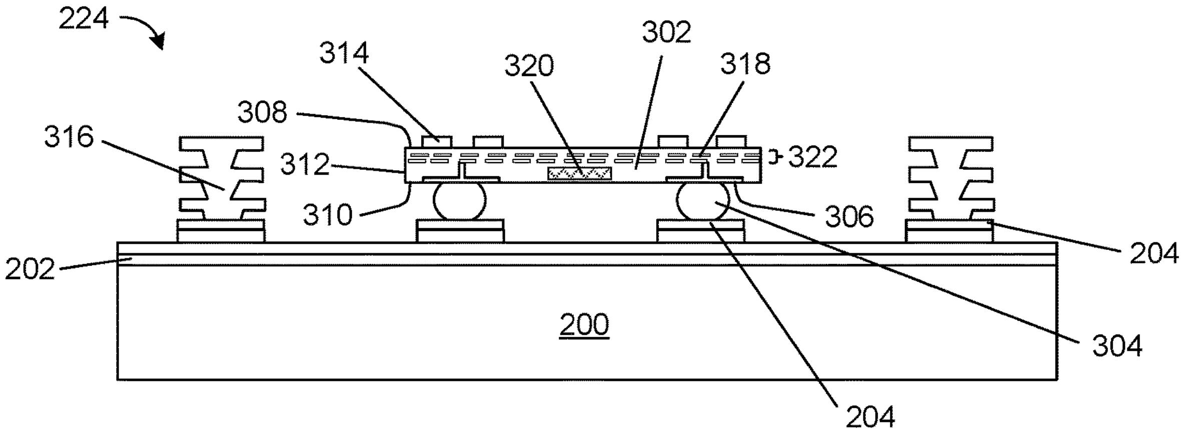
Figure 3D:
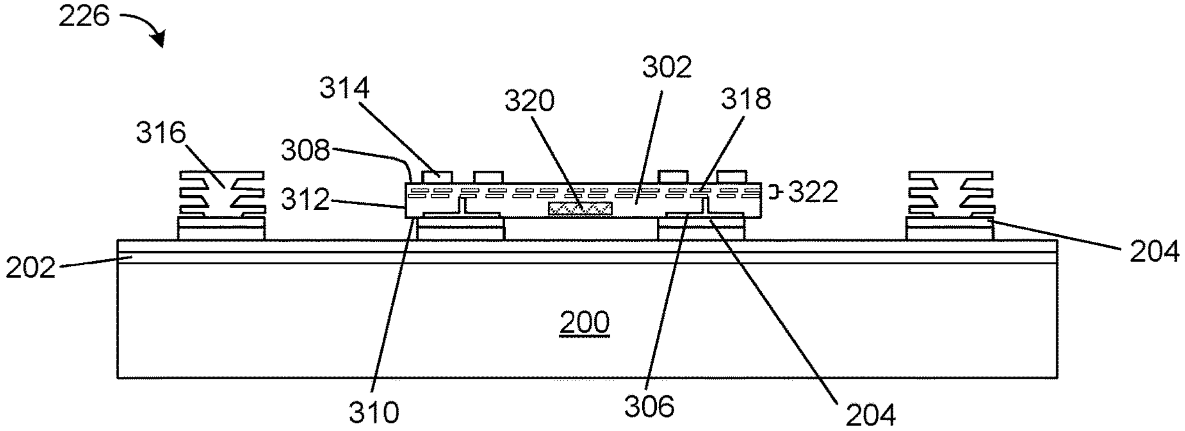

FIG. 2 is a cross-sectional illustration of a glass carrier 200 that may be received as a starting material. The views in FIG. 2 and FIGS. 3A-3N are cross-sectional side views in the y-z plane. The z-dimension in FIG. 2 and FIGS. 3A-3N may be referred to as the height dimension for convenience of reference. The methods 100 employ glass carrier 200 to assist in the manufacturing process, but it is not included in the final IC package. In a later step of the methods 100 the glass carrier 200 is de-paneled. To simplify the illustrations herein, the glass carrier 200 shown in FIG. 2 is sized for a single IC package. It should be appreciated, however, that glass carrier 200 may be of sufficient size to fabricate multiple IC packages simultaneously. Accordingly, the methods 100 can include a singulation step (not shown). Glass carrier 200 may comprise any suitable composition, such as an alkali-free alkaline earth boro-aluminosicilate glass, such as, a glass comprising aluminum, oxygen, boron, silicon, and an alkaline-earth metal (e.g., beryllium, magnesium, calcium, strontium, barium, radium, such as a glass comprising SiO2, Al2O3, B2O3, and MgO) with carefully tailored CTE (coefficient of thermal expansion) and mechanical properties. TBF 202 is applied to a surface of the glass carrier 200. Alternatively, the glass carrier 200 may be received with TBF 202 pre-applied on a surface. The TBF 202 is transparent at specific wavelengths of light. A property of the TBF 202 is that it permits the glass carrier 200 to be de-bonded from an IC package material when exposed to ultraviolet (UV) light.

Returning to FIG. 1A, at block 104 a plurality of package interconnect interfaces (e.g., pillars, pads, etc.) are fabricated on a surface of glass carrier according to any suitable monolithic fabrication technique(s). One side of the plurality of package interconnect interfaces are suitable for solder-based bonding (e.g., microbumps, etc.) or direct bonding to complementary conductive features (e.g., pillars, pads, etc.) of an IC die. An opposite side of the plurality of package interconnect interfaces are suitable for solder-based bonding (e.g., microbumps, etc.) or direct bonding to first level interconnect (FLI) interfaces of a host. In some embodiments, an optional second TBF 206 is applied to TBF 202. The package interconnect interfaces may have any composition and dimension suitable for direct or solder bonding to complementary conductive features of an IC die or a host. In some embodiments, the package interconnect interfaces may be comprised predominantly of Cu. FIG. 3A is a cross-sectional illustration of an IC package 220 at a stage of manufacturing after package interconnect interfaces 204 have been fabricated on surface 208 of the glass carrier 200.

Referring to FIG. 1A, at block 106 a plurality of through-dielectric (TD) interconnect features (e.g., pillars) are fabricated on various ones of the plurality of package interconnect interfaces according to any suitable monolithic fabrication technique(s). The TD interconnect features are referred to herein for ease of reference with the modifier "through-dielectric" because, in some embodiments, they can be encapsulated in a dielectric material. However, it is not essential that the TD interconnect features be encapsulated in dielectric. In some embodiments, the TD interconnect features may be fabricated by building up multiple layers in a deposition and etch process. In some embodiments, the TD interconnect features may be fabricated by filling holes in a glass layer with a conductive material. The TD interconnect features extend in a direction perpendicular to the surface of the glass carrier 200. The TD interconnect features are comprised of an electrically conductive material. In some embodiments, the TD interconnect features may be comprised predominantly of Cu. In an embodiment, the TD interconnect features may be solder. In some embodiments, the TD interconnect features may be used to deliver power from package interconnect interfaces to an IC die. FIG. 3B is a cross-sectional illustration of an IC package 222 at a stage of manufacturing after TD interconnect features 316 have been fabricated on various ones of the package interconnect interfaces 204 of the glass carrier 200, according to some embodiments.

Referring to FIG. 1A, at block 108 an IC die is bonded to various ones of the package interconnect interfaces. FIG. 3C is a cross-sectional illustration of an IC package 224 at a stage of manufacturing after which an IC die 302 has been attached with solder bonds to various ones of the package interconnect interfaces 204, according to some embodiments. Attachment of IC die 302 may comprise any alignment and bonding process suitable for the IC die. For example, an IC die 302 of a relatively large edge size may be handled and aligned to a target location on the glass carrier 200 according to pick-and-place die assembly methods and systems. Many such methods and systems can handle an object as thin as 50 μm and with edge lengths ranging from tens of millimeters down to ~200 μm. IC die attachment at block 108 may also comprise one or more micro device assembly techniques including so-called transfer printing methods, which are capable of handling an object as thin as 1 μm and having lateral dimensions in the tens of micrometers. Such micro device assembly techniques may rely on a MEMS microtool that includes hundreds or even thousands of die attachment points. Micro device assembly methods and systems suitable for inorganic LED (iLED) technology, for example, may be employed at block 108 to transfer a plurality of IC die 302 en masse from a source substrate to the glass substrate 200.

The IC die 302 may be aligned to a target location on the glass substrate 200 with any high-resolution alignment tool, for example of the type found on a wafer-level or chip-level bonding tool commercially available through EVG, SUSS, or TEL, any of which may be employed at block 115. Alignment capability continues to advance, having improved from +/−5 μm to +/−0.2 μm over recent years. Once adequately aligned, the IC die 302 may be bonded to the package interconnect interfaces 204 on the glass substrate 200 with solder features or any direct bonding technique(s) suitable for the IC die 302 and glass substrate 200 interfaces.

In the example shown in FIG. 3C, IC die 302 is attached by solder features 304 to various ones of the package interconnect interfaces 204. Each solder feature 304 is in contact with one of the package interconnect interfaces 204 and a conductive feature 306 of IC die 302. Solder features 304 may be of any composition (e.g., SAC) and applied by any technique.

As shown in FIG. 3C, the IC die 302 comprises a first surface 308, an opposing second surface 310, and at least one sidewall 312 extending between the first surface 308 and the second surface 310. The IC die 302 may include a plurality of first surface interconnect structures 314, such as bumps or pillars on the first surface 308, or metal pads flush with the surface. The IC die 302 may include a plurality of second surface interconnect structures 306, such as bumps or pillars on the second surface 310, or metal pads flush with the surface. As illustrated, the IC die 302 may include a plurality of conductive routes 318 formed therein to connect respective first surface interconnect structures 314 and second surface interconnect structures 306. As further illustrated, a solder material 304 may be applied on the second surface interconnect structures 306 by any appropriate process known in the art, such as with a fine, but uniform pitch using a plating technique.

As mentioned, non-solder embodiments are also possible where conductive feature 306 are directly bonded (e.g., Cu—Cu bumps) to package interconnect interfaces 204. Direct bonding is metal-to-metal bonding in which a metal of a feature in an upper most metallization layer of one IC die sinters with metal of a feature in an upper most metallization layer of another IC die. For example, a package interconnect interface 204 sinters with a metal feature of another IC die. In some embodiments, the IC die 302 is bonded to the package interconnect interfaces 204 through bonds formed between the respective metallization features (e.g., via metal interdiffusion) of another IC die. In some embodiments, an IC package comprises a first IC die bonded to a second IC die through a hybrid bond in which a bond is formed both between metallization features (e.g., via metal interdiffusion) and between dielectric materials (e.g., via Si—O—Si condensation bonds) of the first and second IC die. Thermo-compression bonding may be at low temperature (e.g., below melting temperature of the interconnects, and more specifically below 100° C.). Direct bonding at room temperature (i.e., compression only) is also possible. Prior to bonding, either or both of glass carrier 200 or IC die 302 may be pre-processed, for example with a plasma clean, to activate their surfaces for the bonding. Post bonding, selective or mass heating may be performed, to make permanent the bond (e.g., by strengthening the covalent oxide to oxide bond and/or the metallic Cu—Cu bond through interdiffusion). For selective heating, a heat mask or laser heating may be employed to limit the heat to the specific IC die 302 locations. FIG. 3D is a cross-sectional illustration of an IC package 226 at a stage of manufacturing after which an IC die 302 has been directly bonded to various ones of the package interconnect interfaces 204, according to some embodiments.

In various embodiments, the pitch of first surface interconnect structures 314, the pitch of second surface interconnect structures 306, and/or the pitch of package interconnect interfaces 204 is less than 35 μm. In various embodiments, the pitch of first surface interconnect structures 314, the pitch of second surface interconnect structures 306, and/or the pitch of package interconnect interfaces 204 is greater than or equal to 25 μm. An advantage of embodiments is that the pitch of these interconnect structures may be smaller than the pitch of known interconnects of IC dies similar to IC die 302.

In some embodiments, the IC die 302 may be a passive microelectronic bridge, in that it has no functionality other than to provide the conductive routes 318 between two or more IC devices, for example, between a first IC die coupled with first ones of the first surface interconnect structures 314 and a second IC die coupled with second ones of the first surface interconnect structures 314. In another example of a passive microelectronic bridge, a host device coupled with package interconnect interfaces 204 may communicate, via the second surface interconnect structures 306 and conductive routes 318, with an IC die coupled with first surface interconnect structures 314. The conductive routes 318 may be within one or more signal routing layers 322. The IC die 302 may comprise silicon and may include inter-level dielectric (ILD) material layer(s) (not shown) that can separate two signal routing layers 322. In some embodiments, other materials known to be suitable as microelectronic bridges may also be employed as IC die 302.

In some embodiments, the IC die 302 may be an active microelectronic bridge or other active device, in that it provides functionality beyond merely providing conductive routes 318 between two or more IC devices. The IC die 302 may comprise at least one active component 320, having its own functionality apart from a bridging function, which may be, for example, a microelectronic device, a voltage regulator, a transistor, a resistor, a capacitor, an inductor, or the like. In various embodiments, conductive routes 318 may be within one or more signal routing layers 322, and in some embodiments, at least one active component 320 is electrically attached to one of the conductive routes 318. In some embodiments, at least one active component 320 may be within a signal routing layer 322 and coupled with a conductive route 318.

Returning to FIG. 1A, methods 100 continue at block 110 where a dielectric material is deposited over the IC die bonded to the package interconnect interfaces on the glass substrate and over any portion of the glass substrate not covered by the IC die, according to various embodiments. Dielectric material 324 may encapsulate TD interconnect features 316 and backfill regions over glass carrier 200 beyond sidewall 312 of IC die 302. The dielectric material applied at block 110 therefore substantially backfills portions of the glass carrier 200 where no IC die 302 is present. In some embodiments, multiple dielectric layers may be deposited and/or the dielectric material composition(s) and/or the dielectric material application technique(s) may be selected to achieve layer thicknesses significantly greater than those of a typical BEOL ILD layer. Although a single dielectric material 324 is shown, multiple dielectric material layers may be applied over IC die 302. For example, a first conformal dielectric material layer may be deposited to contact IC die sidewall 312 and a non-conformal, planarizing dielectric material layer may then be deposited over the conformal dielectric material layer. The dielectric material 324 may be applied, for example, with a spin-on technique or and/or a sol-gel technique to substantially cover IC die 302.

Figure 3E:
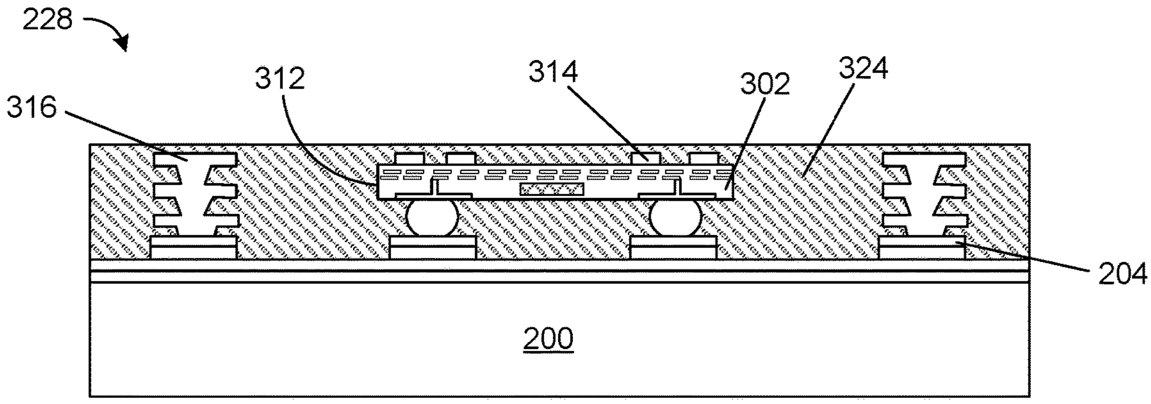

FIG. 3E is a cross-sectional illustration of an IC package 228 at a stage of manufacturing after which a dielectric material 324 has been deposited around IC die 302, according to some embodiments. In various embodiments, dielectric material 324 can be any suitable material, such as an Ajinomoto Build-up Film (ABF) substrate, other dielectric/organic materials, resins, epoxies, polymer adhesives, silicones, acrylics, polyimides, cyanate esters, thermoplastics, and/or thermosets. The dielectric material 324 may be around IC die 302, such as adjacent to side 312, between second surface 310 and TBF 202, and potentially over first surface 308. In some embodiments, one or more redistribution layers (RDL) may be formed within dielectric material 324.

Returning to FIG. 1A, methods 100 continue at block 112 where the dielectric material is planarized to reveal TD interconnect features and first surface interconnect structures, according to some embodiments. For example, a grind and/or polish process may partially remove and/or planarize the dielectric material 324 to expose the TD interconnect features 316 and first surface interconnect structures 314. The planarization operation also provides a flat surface for a glass layer.

At block 114, a glass layer is attached to the dielectric material and thorough vias may be formed in the glass layer, according to some embodiments. An optional adhesive layer 330 may be used, in some embodiments, to attach the glass layer 326 to the dielectric material 324. Adhesive layer 330 may be applied to either the glass layer 326 or applied to the dielectric material 324. In some embodiments, adhesive layer 330 may be omitted: the glass layer 326 is in direct contact with the dielectric material 324, where it is fused with the dielectric material, e.g., in a heating operation. The glass layer 326 may be placed on the dielectric material using any suitable method, such as pick-and-place die assembly methods and systems. The glass layer 326 can be an alkali-free alkaline earth boro-aluminosicilate glass, such as, a glass comprising aluminum, oxygen, boron, silicon, and an alkaline-earth metal (e.g., beryllium, magnesium, calcium, strontium, barium, radium, such as a glass comprising SiO2, Al2O3, B2O3, and MgO), or a photosensitive glass having had property modifications with special treatments. In one example, it may be a lithium-silicate family of glasses, in which an image of a mask can be captured by microscopic metallic particles in the glass when exposed to short wave radiations such as ultraviolet light. Glass layer 326 may have a thickness of between 5 μm and 1.2 mm. In some embodiments, glass layer 326 has a z-dimension thickness of less than 100 microns.

Figure 3F:
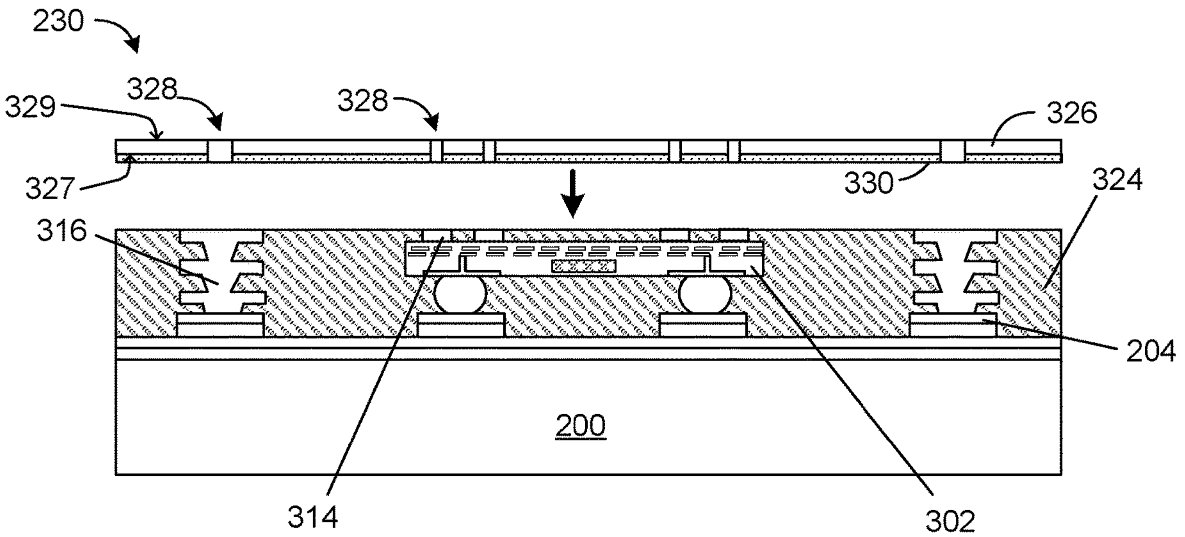

FIG. 3F is a cross-sectional illustration of an IC package 230 at a stage of manufacturing after which dielectric material 324 has been planarized and prior to placement of a glass layer 326 on the dielectric material 324, according to some embodiments. The glass layer 326 comprises a first side 327 and a second side 329. As can be seen in FIG. 3F, end surfaces of TD interconnect features 316 and end surfaces of first surface interconnect structures 314 are exposed. The glass layer 326 comprises holes 328 that extend through the glass layer (and adhesive). The holes may be formed in the glass layer during a casting process or may be formed after the glass layer is attached to the dielectric material, e.g., by imprinting, sand blasting, laser drilling, or etching. Conductive material may be deposited in the holes 328 prior to or after placement of the glass layer 326 on the dielectric material 324. The conductive material may be metals, composite materials, and/or electrically conductive polymers. Suitable metals include copper, tin, silver, gold, nickel, aluminum, and tungsten, as well as alloys of these and/or other metals. Electrically conductive material may be deposited in the holes 328 by any suitable process, such as, for example, screen printing techniques, plating techniques (electroplating or electroless plating), chemical vapor deposition (CVD), and physical vapor deposition (PVD). In an embodiment, a conductor comprises a metal wire embedded in the glass layer. As can be seen in FIG. 3F, the holes 328 are aligned with the exposed surfaces of end surfaces of TD interconnect features 316 and end surfaces of first surface interconnect structures 314.

Figure 3G:
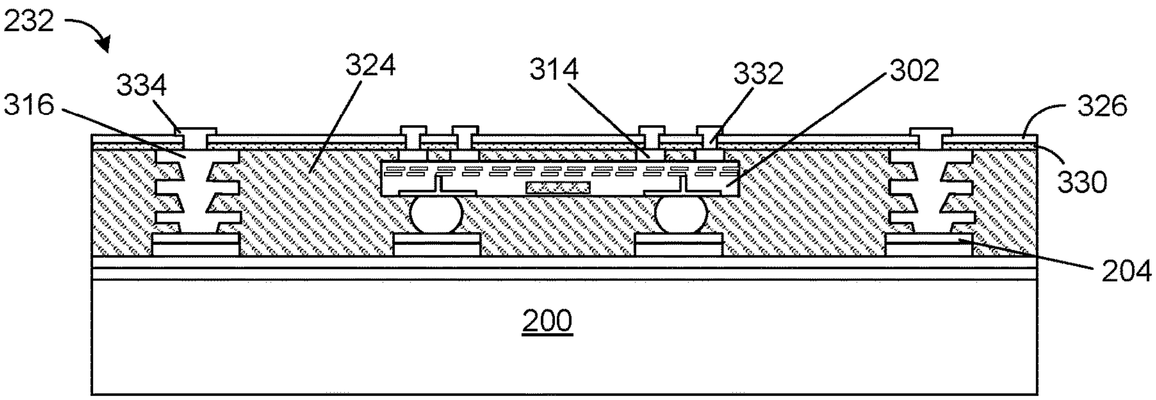
Figure 3H:
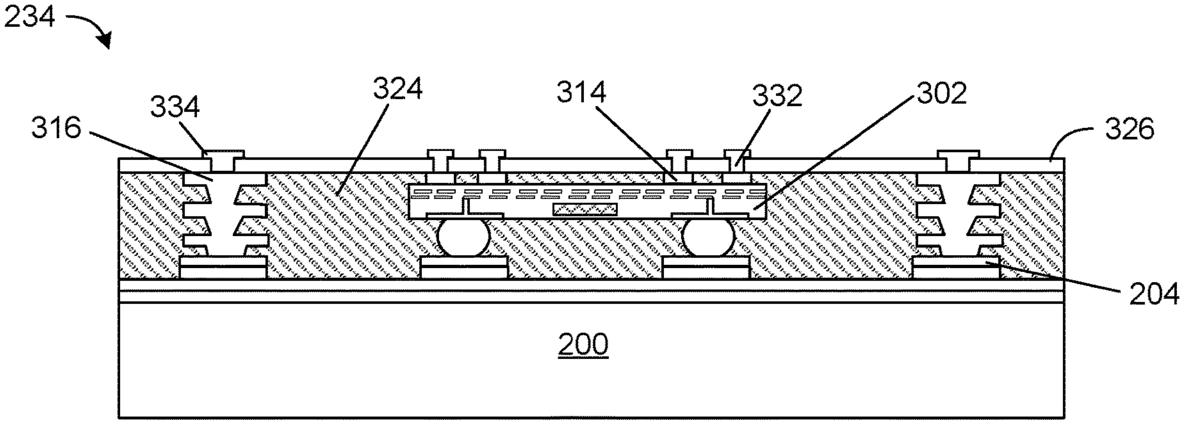

FIG. 3G is a cross-sectional illustration of an IC package 232 at a stage of manufacturing after placement of a glass layer 326 on the dielectric material 324, according to some embodiments. In the example shown in FIG. 3G, the glass layer 326 is attached to the dielectric material 324 with optional adhesive layer 330. FIG. 3H is a cross-sectional illustration of an IC package 234 at a stage of manufacturing after placement of a glass layer 326 on the dielectric material 324 in which optional adhesive layer 330 is omitted, according to some embodiments. It can be seen in FIG. 3G and FIG. 3H that holes 328 are filled with conductive material, forming through vias 332. The conductive material disposed in holes 328 contacts TD interconnect features 316 and first surface interconnect structures 314. In some embodiments, through vias 332 include a conductive pad or contact 334. In some embodiments, contacts 334 are raised above the surface of the glass layer 326 opposite first surface interconnect structures 314. In other embodiments, through vias 332 are flush with the surface of the glass layer 326 opposite first surface interconnect structures 314. As may be seen in FIG. 3G and FIG. 3H, the TD interconnect features 316 extend a first distance in a first direction perpendicular to the surface of the glass layer 326. In some embodiments, the first distance is substantially equal to a thickness of the third die 302, e.g., where package interconnect interfaces 204 and conductive feature 306 are in direct contact. In some embodiments, the first distance is greater than the thickness of the third die 302, e.g., where package interconnect interfaces 204 and conductive feature 306 are connected by solder features 304.

Returning to FIG. 1A, methods 100 continue at block 116 where at least one IC die is bonded to the through vias, according to some embodiments. Metallization features on a side of the IC die are bonded to the through vias. A solder-based bonding technique (e.g., microbumps, etc.) or a direct bonding technique can be used at block 116.

Figure 3I:
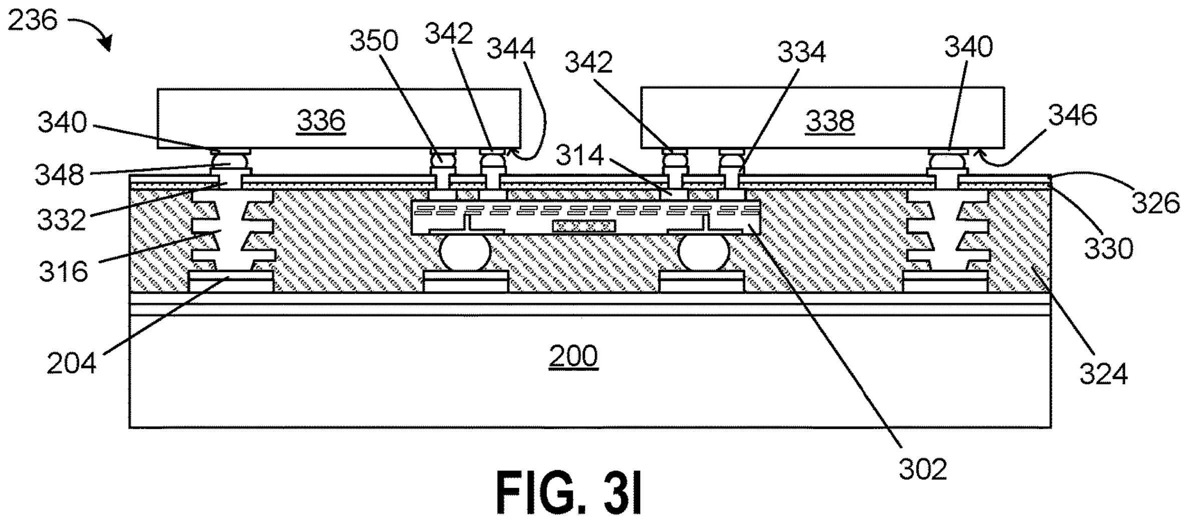

FIG. 3I is a cross-sectional illustration of an IC package 236 at a stage of manufacturing after two IC die have been bonded to the through vias 332, according to some embodiments. As may be seen in FIG. 3I, a first IC die 336 is bonded to through vias 332 at block 116 is separated from another IC die, e.g., IC die 302, by the glass layer 326. The first IC die 332 is interconnected with the other IC die (IC die 302) on the opposite side of the glass layer 326 by way of the through vias 332, which are in contact with the first surface interconnect structures 314 of IC die 302. In addition, the first IC die 336 is interconnected with various ones of the plurality of package interconnect interfaces 204 by way of TD interconnect interfaces 316.

As shown in the example of FIG. 3I, a first IC die 336 comprises first metallization features 340 on a first side 344 of the first IC die, and second IC die 338 comprises second metallization features 342 on a first side 346 of the second IC die. Various ones of through vias 332 couple some of first metallization features 340 with the TD interconnect features 316, while various other ones of the through vias 332 couple other first metallization features 340 with first surface interconnect structures 314 of IC die 302. Similarly, various ones of through vias 332 couple some of second metallization features 342 with the TD interconnect features 316, while various other ones of the through vias 332 couple other second metallization features 342 with first surface interconnect structures 314 of IC die 302.

In some embodiments, the first IC die 336 and second IC die 338 are attached to through vias 332 by solder features 348 and solder features 350, as shown in FIG. 3I. Solder features 348 connect first metallization features 340 of the first IC die 336 and second IC die 338 with TD interconnect features 316. Solder features 350 connect second metallization features 342 of the first IC die 336 and second IC die 338 with first surface interconnect structures 314 of IC die 302. Solder features 348 and 350 may be of any composition (e.g., SAC) and applied by any technique.

Figure 3J:
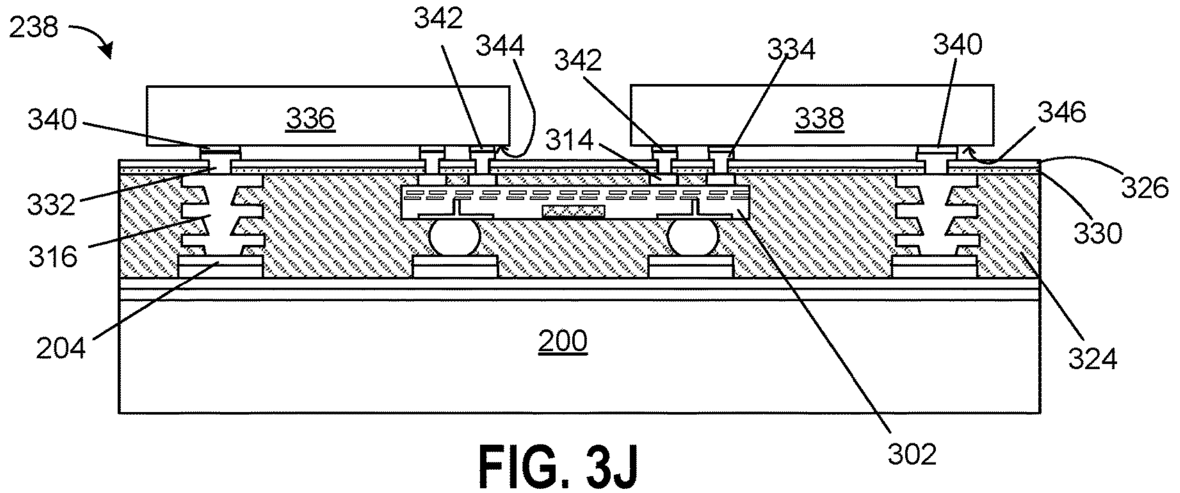

Non-solder embodiments are also possible where first metallization features 340 and second metallization features 342 are directly bonded (e.g., Cu—Cu bumps) to through vias 332. FIG. 3J is a cross-sectional illustration of an IC package 238 at a stage of manufacturing after two IC die have been directly bonded to the through vias 332, according to some embodiments.

In various embodiments, the first IC die 336 can comprise any type of circuitry and the second IC die 338 can comprise any type of circuitry. For example, either of the first IC die 336 or second IC die 338 can comprise a memory, an application specific circuit (ASIC), a processor, a radio frequency (RF) IC, or a baseband processor. In an embodiment, first IC die 336 is a processor and is a memory. Each of the first IC die 336 and second IC die 338 comprise metallization layers, each including any number of conductive layers separated by ILD layers.

Figure 1B:
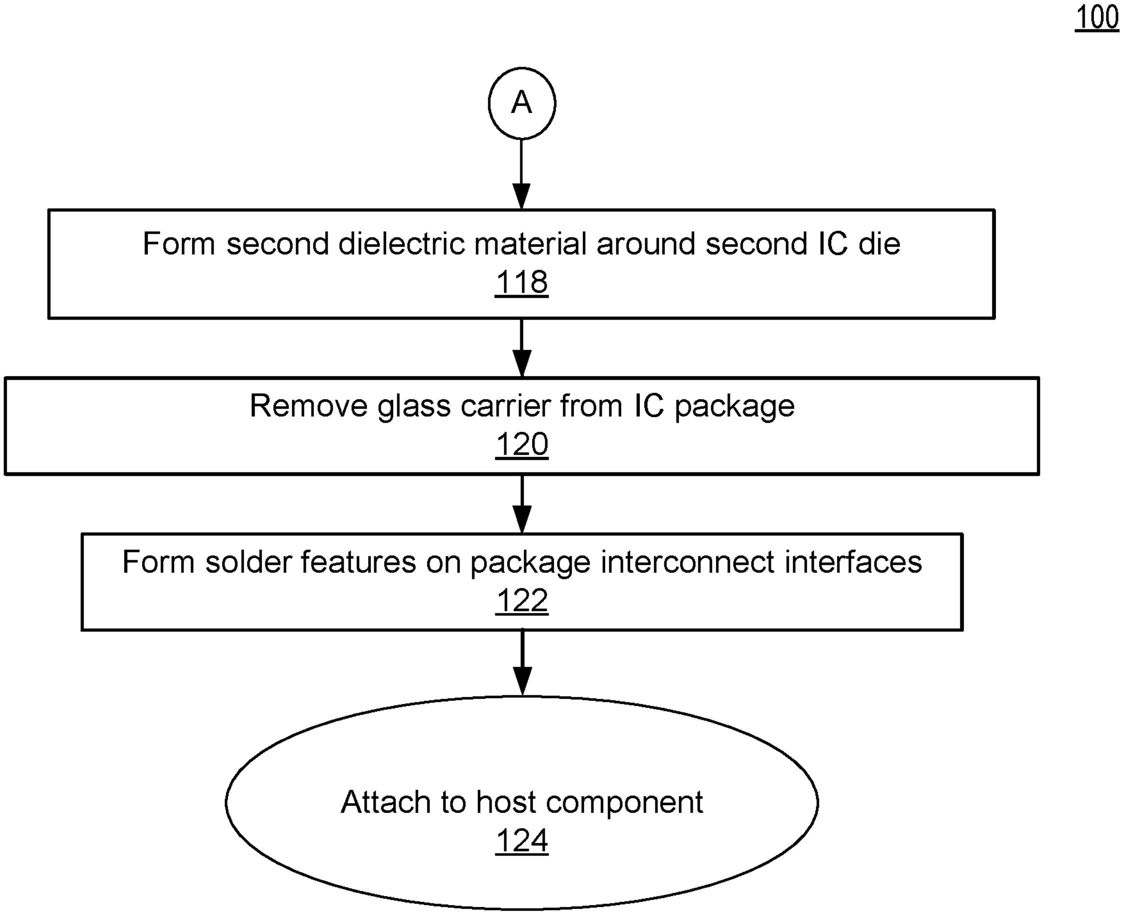
Figure 3K:
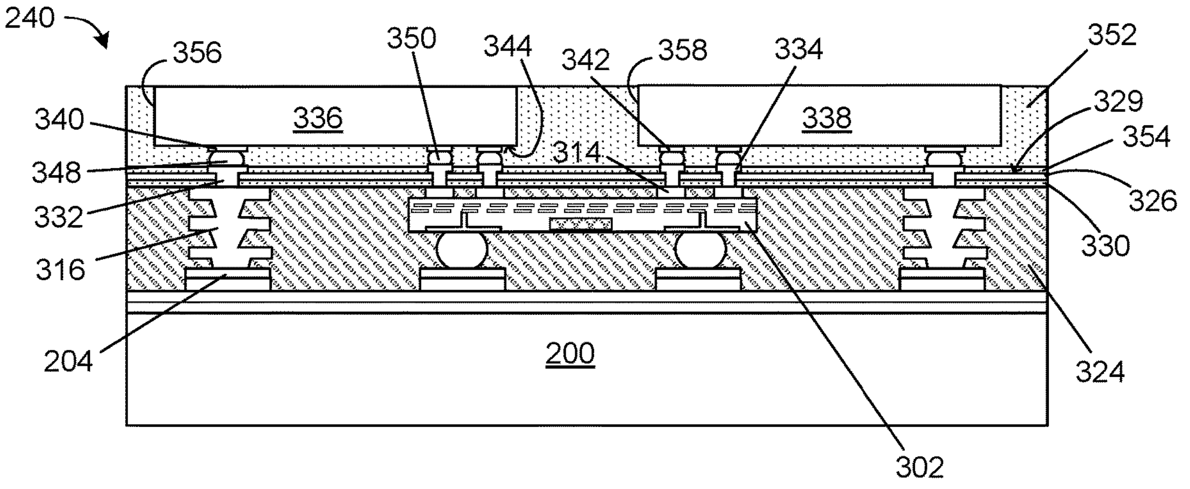

Referring to FIG. 1B, methods 100 continue at block 118 where a second dielectric material is deposited over the at least one IC die and over any portion of a second side of the glass substrate not covered by the at least one IC die, according to various embodiments. FIG. 3K is a cross-sectional illustration of an IC package 240 at a stage of manufacturing after a second dielectric material 352 is deposited over the first IC die 336, the second IC die 338, and over any portion of a second side 329 of the glass layer 326 not covered by the first and second IC die, according to some embodiments. Dielectric material 352 may encapsulate the first IC die 336 and second IC die 338, and backfill regions over glass layer 326 beyond respective sidewalls 356 and 358 of the IC die 336, 338. The dielectric material applied at block 118 therefore substantially backfills portions of the glass layer 326 where no IC die is present. Although a single dielectric material 352 is shown, multiple dielectric material layers may be applied over the IC die 336, 338. For example, a first conformal dielectric material layer may be deposited to contact IC die sidewall 356, 358 and a non-conformal, planarizing dielectric material layer may then be deposited over the conformal dielectric material layer. The dielectric material 352 may be applied, for example, with a spin-on technique or and/or a sol-gel technique to substantially cover the IC die 336, 338. The dielectric material 352 may comprise any suitable material, such as an Ajinomoto Build-up Film (ABF) substrate, other dielectric/organic materials, resins, epoxies, polymer adhesives, silicones, acrylics, polyimides, cyanate esters, thermoplastics, and/or thermosets.

Operations performed at block 118 can include a planarization process. In some embodiments, the dielectric material 352 is planarized to reveal top sides of one or both of the IC die 336 or IC die 338, according to some embodiments. In this regard, it should be appreciated that while IC die 336 and IC die 338 are illustrated in FIG. 3K as having the same z-height, this is not required. The respective z-heights of IC die 336 and IC die 338 may be different. In such cases, the top side of the shorter IC die is not revealed. For example, IC die 336 may have a first z-height and IC die 338 may comprise a second z-height, which is greater that the first IC die 338. In another examples, IC die 338 may comprise two or more stacked IC die, e.g., stacked memory devices. The z-height of the stacked IC die may be a multiple of the z-height of the first IC die 338. The planarization process can be performed using, for example, a grind and/or polish process may partially remove and/or planarize the dielectric material 352.

Operations performed at block 118 can include application of an optional second adhesive layer 354 that may be used, in some embodiments, to attach the dielectric material 352 to the glass layer 326. In some embodiments, second adhesive layer 354 may be omitted and the glass layer 326 is in direct contact with the dielectric material 352, where it is fused with the dielectric material, e.g., in a heating operation.

Figure 3L:
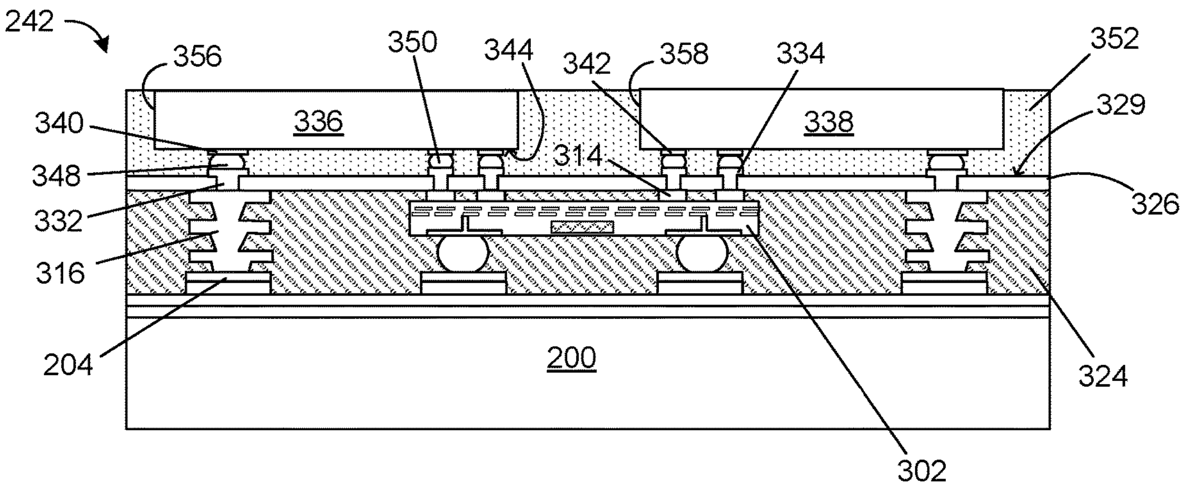

FIG. 3L is a cross-sectional illustration of an IC package 242 at a stage of manufacturing after the second dielectric material 352 is deposited over the first IC die 336, the second die 338, and over any portion of a second side 329 of the glass layer 326 not covered by the first and second IC die in which optional second adhesive layer 354 is omitted, according to some embodiments. FIG. 3L also depicts the IC package 242 at a stage of manufacturing after a planarization operation.

Figure 3M:
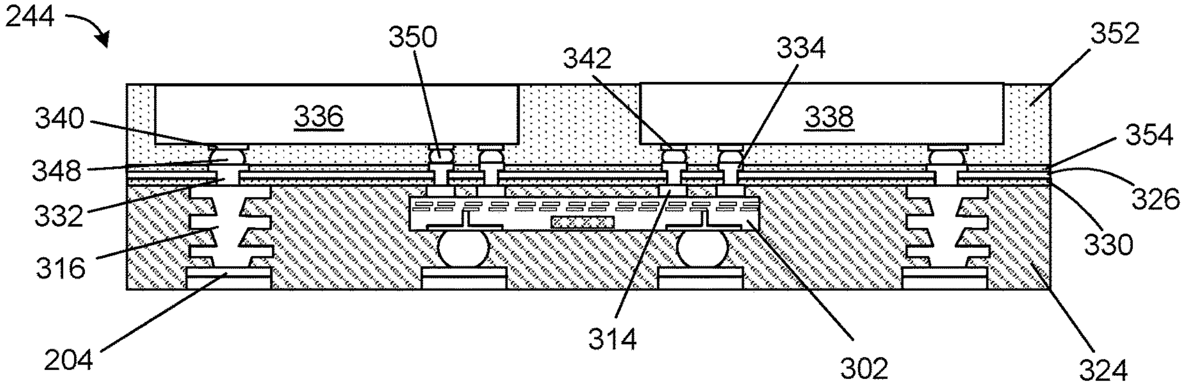
Figure 3N:
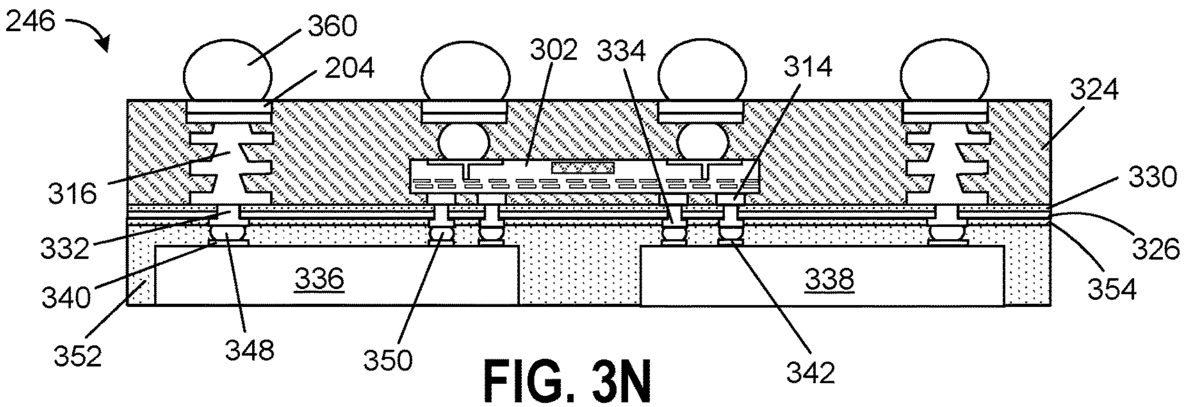

Referring to FIG. 1B, methods 100 continue at block 120 where a glass carrier is removed from an IC package, according to various embodiments. TBF 202 may also be removed at block 120. FIG. 3M is a cross-sectional illustration of an IC package 244 at a stage of manufacturing after glass carrier 200 is removed from the IC package, according to some embodiments.

Referring to FIG. 1B, methods 100 continue at block 122 where an IC package is inverted and solder features are formed on package interconnect interfaces, according to various embodiments. FIG. 3N is a cross-sectional illustration of an IC package 246 at a stage of manufacturing after solder features 360 have been formed on package interconnect interfaces 204, according to some embodiments.

Upon completing the fabrication of an IC package, at block 124 the IC package may be packaged and/or interconnected to any host component to which any IC package or monolithic IC chip may be attached. The IC package 246 may be connected to a host component or other device via the solder features 360 on package interconnect interfaces 204.

Figure 4:
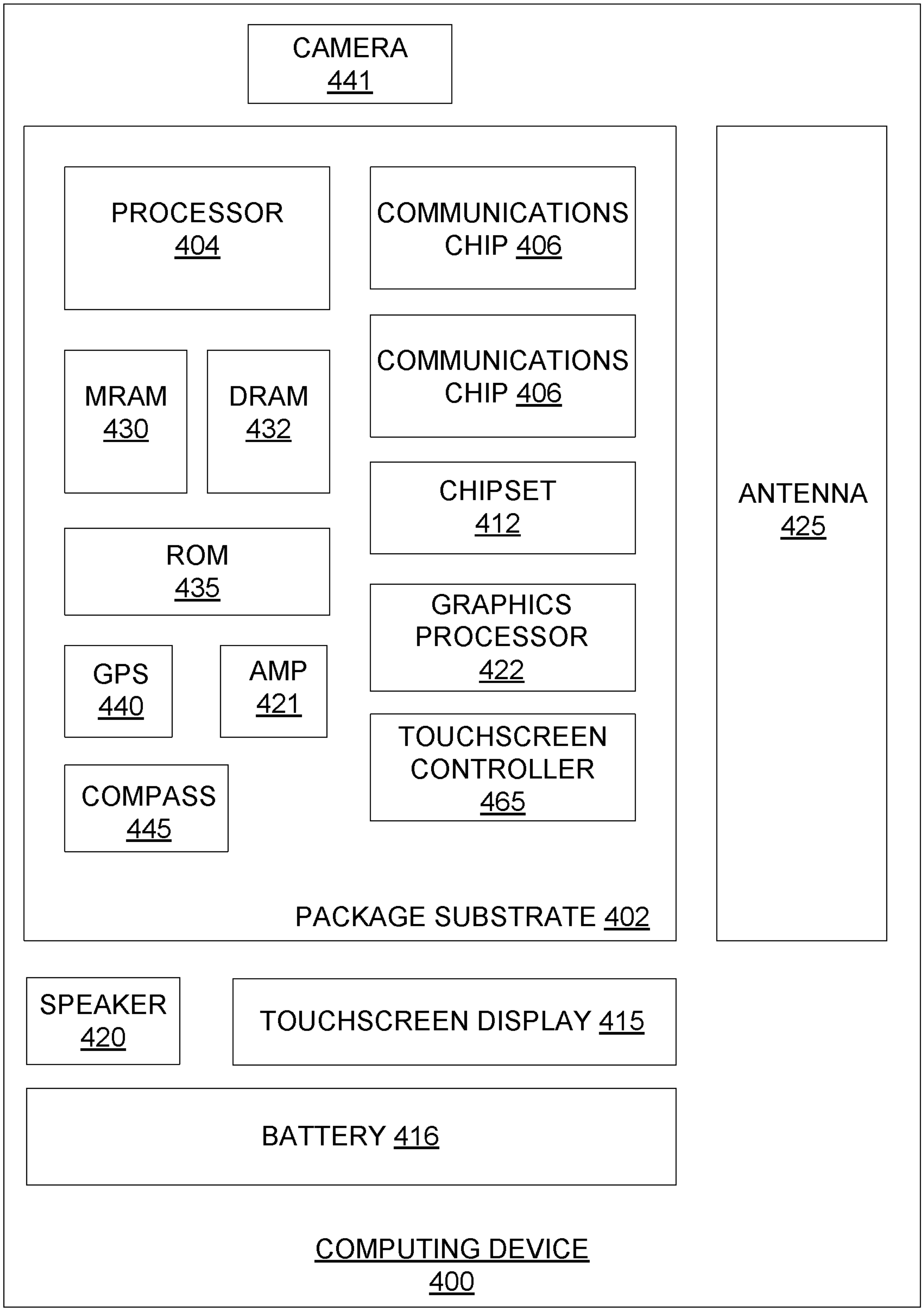
FIG. 4 is a functional block diagram of an electronic computing device, in accordance with some embodiments.

FIG. 4 is a functional block diagram of an electronic computing device 400, in accordance with an embodiment of the present invention. Device 400 further includes a package substrate 402 hosting a number of components, such as, but not limited to, a processor 404 (e.g., an applications processor). Processor 404 may be physically and/or electrically coupled to package substrate 402. In some examples, processor 404 is within an IC package including a glass layer between a third IC die and both of first and second IC die, the glass layer having through vias coupling the IC die, for example as described elsewhere herein. Processor 404 may be implemented with circuitry in either or both of the host IC chip and chiplet. In general, the term "processor" or "microprocessor" may refer to any device or portion of a device that processes electronic data from registers and/or memory to transform that electronic data into other electronic data that may be further stored in registers and/or memory.

In various examples, one or more communication chips 406 may also be physically and/or electrically coupled to the package substrate 402. In further implementations, communication chips 406 may be part of processor 404. Depending on its applications, computing device 400 may include other components that may or may not be physically and electrically coupled to package substrate 402. These other components include, but are not limited to, volatile memory (e.g., DRAM 432), non-volatile memory (e.g., ROM 435), flash memory (e.g., NAND or NOR), magnetic memory (MRAM 430), a graphics processor 422, a digital signal processor, a crypto processor, a chipset 412, an antenna 425, touchscreen display 415, touchscreen controller 465, battery 416, audio codec, video codec, power amplifier 421, global positioning system (GPS) device 440, compass 445, accelerometer, gyroscope, speaker 420, camera 441, and mass storage device (such as hard disk drive, solid-state drive (SSD), compact disk (CD), digital versatile disk (DVD), and so forth), or the like. In some exemplary embodiments, at two of the functional blocks noted above are within a composite IC chip structure including a chiplet bonded to a host IC chip, for example as described elsewhere herein. For example, processor 404 may be implemented within circuitry in a first IC die, and an electronic memory (e.g., MRAM 430 or DRAM 432) may be implemented with circuitry in a second IC die.

Communication chips 406 may enable wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 406 may implement any of a number of wireless standards or protocols. As discussed, computing device 400 may include a plurality of communication chips 406. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

Figure 5:
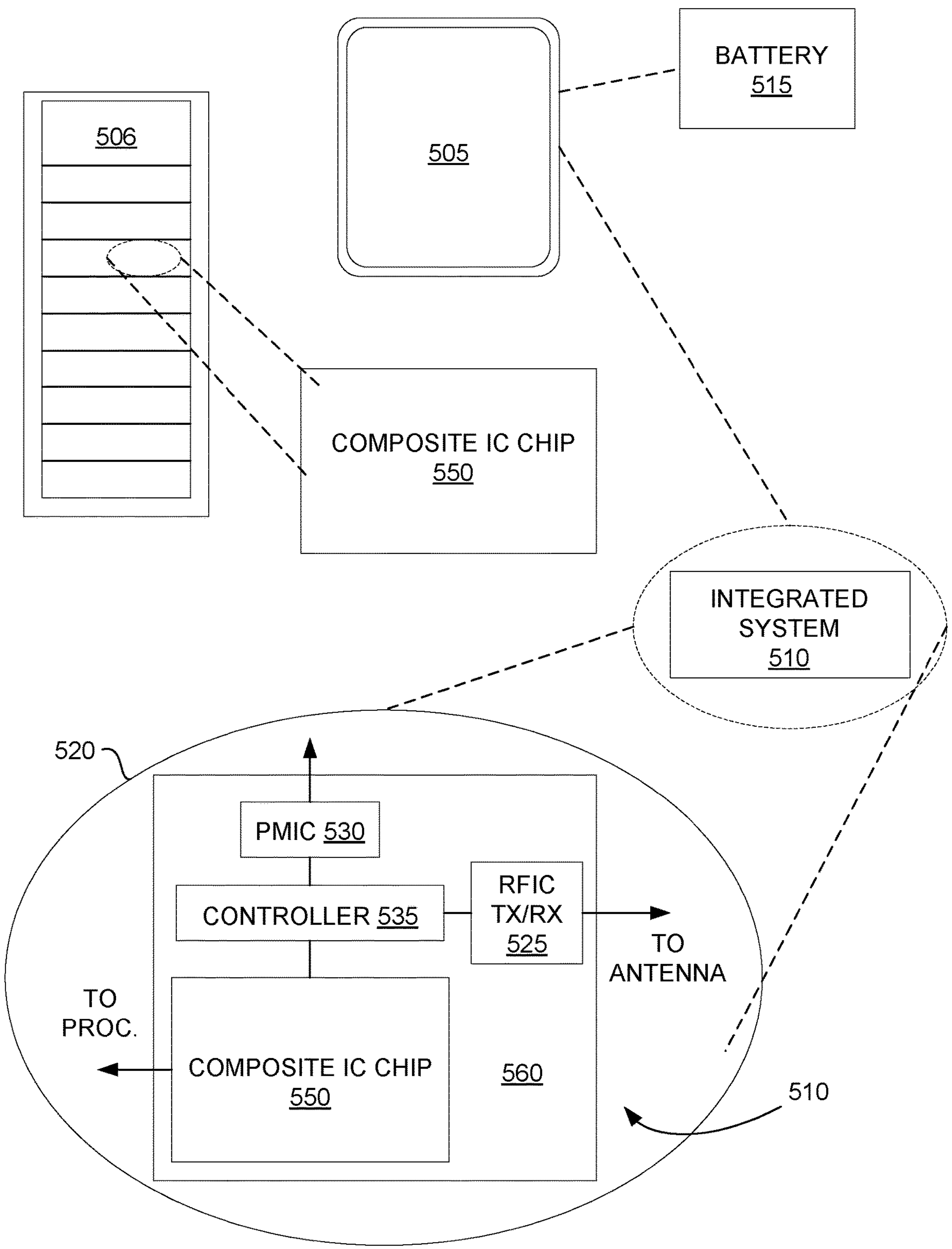
FIG. 5 illustrates a mobile computing platform and a data server machine employing a composite IC chip structure, in accordance with some embodiments.

FIG. 5 illustrates a mobile computing platform and a data server machine employing a composite IC chip structure, for example as described elsewhere herein. Computing device 400 may be found inside platform 505 or server machine 506, for example. The server machine 506 may be any commercial server, for example including any number of high-performance computing platforms disposed within a rack and networked together for electronic data processing, which in the exemplary embodiment includes an IC package including a glass layer between a third IC die and both of first and second IC die, the glass layer having through vias coupling the IC die, for example as described elsewhere herein. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Whether disposed within the integrated system 510 illustrated in the expanded view 520, or as a stand-alone package within the server machine 506, an IC package including a glass layer between a third IC die and both of first and second IC die, the glass layer having through vias coupling the IC die, for example as described elsewhere herein. Composite IC chip 550 may be further coupled to a host substrate 560, along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front-end module further comprises a power amplifier on a transmit path and a low noise amplifier on a receive path), and a controller 535. PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example, the above embodiments may include specific combinations of features as further provided below.

Example 1: An integrated circuit (IC) package comprising: a first IC die comprising first metallization features on a first side of the first IC die; a second IC die laterally adjacent to the first IC die and comprising second metallization features on a first side of the second IC die; a third IC die comprising third metallization features on a first side of the third IC die; a glass layer between the third IC die and both of the first IC die and the second IC die; a plurality of first through vias extending through the glass layer and coupling the third metallization features with first ones of the first metallization features and with first ones of the second metallization features; a plurality of second through vias extending through the glass layer; a dielectric material around the third die; and a package metallization within the dielectric material, the package metallization coupled to at least one of the first, second, or third IC die, and terminating at a plurality of package interconnect interfaces.

Example 2: The IC package of example 1, wherein first ones of the first metallization features comprise predominantly Cu and are in direct contact with respective ones of the plurality of first through vias, and first ones of the second metallization features comprises predominantly Cu and are in direct contact with respective ones of the plurality of first through vias.

Example 3: The IC package of example 1, wherein the first through vias are coupled to the first ones of the first and second metallization features through a solder.

Example 4: The IC package of any of examples 1 to 3, wherein the third metallization features comprise predominantly Cu and are in direct contact with respective ones of the plurality of first through vias.

Example 5: The IC package of any one of examples 1, 2, or 4, wherein the plurality of second through vias couple the package metallization with second ones of the first metallization features and with second ones of the second metallization features, wherein the second ones of the first metallization features comprise predominately Cu and are in direct contact with respective ones of the second through vias; and the second ones of the second metallization features comprise predominately Cu and are in direct contact with respective ones of the second through vias.

Example 6: The IC package of any one of examples 1, 3, or 4, wherein the plurality of second through vias couple the package metallization with second ones of the first metallization features and with second ones of the second metallization features, wherein the second through vias are coupled to the second ones of the first and second metallization features through a solder.

Example 7: The IC package of any one of examples 1 to 6, further comprising fourth metallization features on a second side of the third die opposite the first side of the third die, wherein the fourth metallization features are in direct contact with respective ones of the package interconnect interfaces.

Example 8: The IC package of any one of examples 1 to 6, further comprising fourth metallization features on a second side of the third IC die opposite the first side of the third die, wherein the package metallization comprises solder features connecting the fourth metallization features with respective ones of the package interconnect interfaces.

Example 9: The IC package of any one of examples 1 to 8, wherein the package metallization comprises through-dielectric interconnect features comprised predominately Cu and in direct contact with the plurality of second through vias and with respective ones of the package interconnect interfaces.

Example 10: The IC package of any one of examples 1 to 9, wherein a surface of the glass layer is parallel to the first side of the third IC die, the through-dielectric interconnect features extend a first distance in a first direction perpendicular to the surface of the glass layer, and the first distance is greater than or substantially equal to a thickness of the third die.

Example 11: The IC package of any one of examples 1 to 10, further comprising an adhesion layer between the glass layer and the dielectric material, wherein the adhesion layer comprises an epoxy polymer.

Example 12: The IC package of any one of examples 1 to 11, wherein the dielectric material comprises one of a mold compound, Ajinomoto Build-up Film (ABF), or a polyimide material.

Example 13: The IC package of any one of examples 1 to 12, further comprising a second dielectric material around the first and second IC die, and an adhesion layer between the glass layer and the second dielectric material, wherein the second dielectric material comprises one of a mold compound, Ajinomoto Build-up Film (ABF), or polyamide material, and the adhesion layer comprises an epoxy polymer.

Example 14: The IC package of any one of examples 1 to 13, wherein a thickness of the glass layer is less than 100 microns.

Example 15: A system comprising: a microprocessor, wherein the microprocessor comprises circuitry on a first IC die and comprising first metallization features on a first side of the second IC die; a memory coupled to the microprocessor, wherein the memory comprises circuitry on a second IC die laterally adjacent to the first IC die and comprising second metallization features on a first side of the second IC die; a communication bridge, wherein the communication bridge comprises a third IC die comprising third metallization features on a first side of the third IC die; a glass layer between the third IC die and both of the first die and the second IC die; a plurality of first through vias extending through the glass layer and coupling the third metallization features with first ones of the first metallization features and with first ones of the second metallization features; and a dielectric material around the third IC die comprising a package metallization, wherein the package metallization is coupled to at least one of the first, second, or third IC die, and terminates at a plurality of package interconnect interfaces.

Example 16: The system of example 15, wherein first ones of the first metallization features comprise predominantly Cu and are in direct contact with respective ones of the plurality of first through vias, and first ones of the second metallization features comprises predominantly Cu and are in direct contact with respective ones of the plurality of first through vias.

Example 17: The system of example 15 or 16, wherein the third metallization features comprise predominantly Cu and are in direct contact with respective ones of the plurality of first through vias.

Example 18: The system of any one of examples 15 to 17, further comprising a plurality of second through vias extending through the glass layer, wherein the plurality of second through vias couple the package metallization with second ones of the first metallization features and with second ones of the second metallization features.

Example 19: A method for fabricating an IC device structure, the method comprising: receiving a first IC die comprising first metallization features on a first side of the first die; receiving a second IC comprising second metallization features on a first side of the second die; receiving a third IC die comprising third metallization features on a first side of the third die; placing a glass layer between the third die and both of the first die and the second die, wherein the second IC die is laterally adjacent to the first die, a plurality of first through vias extend through the glass layer and couple the third metallization features with first ones of the first metallization features and with first ones of the second metallization features, and a plurality of second through vias extend through the glass layer; forming a dielectric material around the third die; and forming a package metallization within the dielectric material, the package metallization coupled to at least one of the first, second, or third IC die, and terminating at a plurality of package interconnect interfaces.

Example 20: The method of example 19, further comprising: bonding the third metallization features with respective ones of the plurality of first through vias, wherein the third metallization features comprise predominantly Cu and are in direct contact with respective ones of the plurality of first through vias.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should therefore be determined with reference to the appended claims, along with the full scope of equivalents to which such claims are entitled.

What is claimed is:

1. An integrated circuit (IC) package comprising:

a first IC die comprising first metallization features on a first side of the first IC die;

a second IC die laterally adjacent to the first IC die and comprising second metallization features on a first side of the second IC die;

a third IC die comprising third metallization features on a first side of the third IC die;

a glass layer between the third IC die and both of the first IC die and the second IC die;

a plurality of first through vias extending through the glass layer and coupling the third metallization features with first ones of the first metallization features and with first ones of the second metallization features, wherein each third metallization feature is over one of the first through vias;

a plurality of second through vias extending through the glass layer;

a dielectric material around the third IC die; and a package metallization within the dielectric material, the package metallization coupled to at least one of the first, second, or third IC die, and terminating at a plurality of package interconnect interfaces.

2. The IC package of claim 1, wherein first ones of the first metallization features comprise predominantly Cu and are in direct contact with respective ones of the plurality of first through vias, and first ones of the second metallization features comprise predominantly Cu and are in direct contact with respective ones of the plurality of first through vias.

3. The IC package of claim 1, wherein the first through vias are coupled to the first ones of the first and second metallization features through a solder.

4. The IC package of claim 1, wherein the third metallization features comprise predominantly Cu and are in direct contact with respective ones of the plurality of first through vias.

5. The IC package of claim 1, wherein the plurality of second through vias couple the package metallization with second ones of the first metallization features and with second ones of the second metallization features, wherein:

the second ones of the first metallization features comprise predominately Cu and are in direct contact with respective ones of the second through vias; and the second ones of the second metallization features comprise predominately Cu and are in direct contact with respective ones of the second through vias.

6. The IC package of claim 1, wherein the plurality of second through vias couple the package metallization with second ones of the first metallization features and with second ones of the second metallization features, wherein:

the second through vias are coupled to the second ones of the first and second metallization features through a solder.

7. The IC package of claim 1, further comprising fourth metallization features on a second side of the third IC die opposite the first side of the third IC die, wherein:

the fourth metallization features are in direct contact with respective ones of the package interconnect interfaces.

8. The IC package of claim 1, further comprising fourth metallization features on a second side of the third IC die opposite the first side of the third IC die, wherein:

the package metallization comprises solder features connecting the fourth metallization features with respective ones of the package interconnect interfaces.

9. The IC package of claim 1, wherein the package metallization comprises through-dielectric interconnect features comprised predominately Cu and in direct contact with the plurality of second through vias and with respective ones of the package interconnect interfaces.

10. The IC package of claim 9, wherein a surface of the glass layer is parallel to the first side of the third IC die, the through-dielectric interconnect features extend a first distance in a first direction perpendicular to the surface of the glass layer, and the first distance is greater than or substantially equal to a thickness of the third IC die.

11. The IC package of claim 1, further comprising an adhesion layer between the glass layer and the dielectric material, wherein the adhesion layer comprises an epoxy polymer.

12. The IC package of claim 1, wherein the dielectric material comprises one of a mold compound, Ajinomoto Build-up Film (ABF), or a polyimide material.

13. The IC package of claim 1, further comprising a second dielectric material around the first and second IC die, and an adhesion layer between the glass layer and the second dielectric material, wherein the second dielectric material comprises one of a mold compound, Ajinomoto Build-up Film (ABF), or polyamide material, and the adhesion layer comprises an epoxy polymer.

14. The IC package of claim 1, wherein a thickness of the glass layer is less than 100 microns.

15. A system comprising:

a microprocessor, wherein the microprocessor comprises circuitry on a first IC die and comprising first metallization features on a first side of the first IC die;

a memory coupled to the microprocessor, wherein the memory comprises circuitry on a second IC die laterally adjacent to the first IC die and comprising second metallization features on a first side of the second IC die;

a communication bridge, wherein the communication bridge comprises a third IC die comprising third metallization features on a first side of the third IC die;

a glass layer between the third IC die and both of the first IC die and the second IC die;

a plurality of through vias extending through the glass layer and coupling the third metallization features with first ones of the first metallization features and with first ones of the second metallization features, wherein each of the first ones of the first metallization features and each of the first ones of the second metallization features is under one of the through vias; and a dielectric material around the third IC die comprising a package metallization, wherein the package metallization is coupled to at least one of the first, second, or third IC die, and terminates at a plurality of package interconnect interfaces.

16. The system of claim 15, wherein first ones of the first metallization features comprise predominantly Cu and are in direct contact with respective ones of the plurality of first through vias, and first ones of the second metallization features comprise predominantly Cu and are in direct contact with respective ones of the plurality of first through vias.

17. The system of claim 15, wherein the third metallization features comprise predominantly Cu and are in direct contact with respective ones of the plurality of through vias.

18. The system of claim 15, wherein the through vias are first through vias, further comprising a plurality of second through vias extending through the glass layer, wherein the plurality of second through vias couple the package metallization with second ones of the first metallization features and with second ones of the second metallization features.

19. A method for fabricating an IC device structure, the method comprising:

receiving a first IC die comprising first metallization features on a first side of the first IC die;

receiving a second IC die comprising second metallization features on a first side of the second IC die;

receiving a third IC die comprising third metallization features on a first side of the third IC die;

placing a glass layer between the third IC die and both of the first IC die and the second IC die, wherein the second IC die is laterally adjacent to the first IC die, a plurality of first through vias extend through the glass layer and couple the third metallization features with first ones of the first metallization features and with first ones of the second metallization features, each third metallization feature is vertically aligned with one of the first through vias, and a plurality of second through vias extend through the glass layer;

forming a dielectric material around the third IC die; and forming a package metallization within the dielectric material, the package metallization coupled to at least one of the first, second, or third IC die, and terminating at a plurality of package interconnect interfaces.

20. The method of claim 19, further comprising:

bonding the third metallization features with respective ones of the plurality of first through vias, wherein the third metallization features comprise predominantly Cu and are in direct contact with respective ones of the plurality of first through vias.

* * * * *